US011321550B2

(12) United States Patent
Hanajima (10) Patent No.: US 11,321,550 B2
(45) Date of Patent: May 3, 2022

(54) PROCESSING APPARATUS AND CHUCK TABLE (71) Applicant: DISCO CORPORATION, Tokyo (JP)

(72) Inventor: Satoshi Hanajima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 65 days.

(21) Appl. No.: 16/910,501

(22) Filed: Jun. 24, 2020

(65) Prior Publication Data

US 2021/0004553 A1 Jan. 7, 2021

(30) Foreign Application Priority Data

Jul. 1, 2019 (JP) .............................. JP2019-122995

(51) Int. Cl.
G05B 19/00 (2006.01)
G06K 7/14 (2006.01)
G05B 19/402 (2006.01)
G06K 7/10 (2006.01)

(52) U.S. Cl.
CPC ......... G06K 7/1417 (2013.01); G05B 19/402 (2013.01); G06K 7/10366 (2013.01); G05B 2219/45031 (2013.01)

(58) Field of Classification Search
None
See application file for complete search history.

(56) References Cited

U.S. PATENT DOCUMENTS

| 2003/0077993 | A1* | 4/2003 | Shimobeppu | ........... B24B 37/30 451/364 |
| 2015/0239093 | A1* | 8/2015 | Fukui | ................ H01L 23/49524 451/5 |
| 2018/0259930 | A1* | 9/2018 | Oikawa | .............. G05B 19/4083 |
| 2021/0031261 | A1* | 2/2021 | Wirtz, II | ................. H01M 4/72 |

FOREIGN PATENT DOCUMENTS

| JP | 2013052483 A | 3/2013 |
| JP | 2018027601 A | 2/2018 |

OTHER PUBLICATIONS

JPO Machine Translation of the Detailed Description of Invention for JP2018027601A (which was cited in the Jun. 24, 2020 IDS) (Year: 2018).*
Search report issued in counterpart Singapore patent application No. 10202005657X, dated Mar. 23, 2021.

* cited by examiner

*Primary Examiner* — Paul B Yanchus, III
(74) *Attorney, Agent, or Firm* — Greer, Burns & Crain, Ltd.

(57) ABSTRACT

A processing apparatus includes a chuck table, a processing unit configured to process a workpiece held on the chuck table, a height measuring unit fitted to the processing unit, the height measuring unit measuring, as height data, heights at a plurality of coordinates of the holding surface measured while a moving unit is moved, a reading unit capable of reading an information medium, and a control unit. The chuck table includes an information medium on which identifying information distinguishing the chuck table is (Continued)

recorded. The control unit includes a height data recording section configured to record the height data and the identifying information in association with each other, and a processing control section configured to control a height of the processing unit during processing on the basis of the height data associated with the identifying information read by the reading unit.

8 Claims, 10 Drawing Sheets

PROCESSING APPARATUS AND CHUCK TABLE

BACKGROUND OF THE INVENTION

Field of the Invention

The present invention relates to a processing apparatus and a chuck table.

Description of the Related Art

A processing apparatus is known which cuts a workpiece such as a semiconductor wafer by a cutting blade mounted on a spindle, and thereby forms a groove of a desired depth in the workpiece or divides the workpiece. A technology has been developed which controls the cutting depth of the cutting blade with respect to the workpiece when the groove of the desired depth is formed in the workpiece with high depth accuracy, for example.

When the cutting depth of the cutting blade with respect to the workpiece is controlled, a distance between a cutting edge of the cutting blade and a holding surface of a chuck table needs to be controlled accurately. Generally, a point at which the edge (lower end) of the cutting blade and the holding surface of the chuck table are in contact with each other is registered (set up) as what is called an origin position, and the cutting depth is controlled by controlling a distance (height) from the point.

However, the holding surface of the chuck table may have variations in height in units of a few μm and an inclination. Therefore, when the one origin position is applied to the entire holding surface, an error may be caused in accuracy of the cutting depth. In addition, there is a limit to straightness of a Y-axis moving unit that moves the spindle in an indexing feed direction (Y-axis direction) and an X-axis moving unit that moves the chuck table in a processing feed direction (X-axis direction). Therefore, when the cutting depth is desired to be controlled with a very high accuracy, it is necessary to register origin positions on the entire surface of the chuck table and correct movement on each of the X, Y, and Z axes according to the origin positions.

In view of such a point, a technology has been proposed which measures the height of the holding surface of the chuck table at a plurality of coordinates and stores relation between the respective coordinates and heights (see Japanese Patent Laid-Open No. 2018-27601, for example).

SUMMARY OF THE INVENTION

In a field of mass production of chips, the chuck table included in the processing apparatus may be replaced for processing of a wafer having a different diameter or for periodic inspection. The above-described processing apparatus is desired to enhance accuracy of the cutting depth of the cutting blade with respect to the workpiece and prevent a decrease in processing quality of the workpiece even when the chuck table is replaced.

It is accordingly an object of the present invention to provide a processing apparatus and a chuck table that can prevent a decrease in processing quality of a workpiece which may be attendant on chuck table replacement.

In accordance with an aspect of the present invention, there is provided a processing apparatus including a chuck table having a holding surface configured to hold a workpiece and a frame body surrounding the holding surface, a processing unit configured to process the workpiece held on the chuck table, a moving unit configured to move the chuck table and the processing unit relative to each other in an X-axis direction parallel with the holding surface and a Y-axis direction orthogonal to the X-axis direction, a height measuring unit fitted to the processing unit, the height measuring unit measuring, as height data, heights (Z) at a plurality of coordinates (X, Y) of the holding surface measured while the moving unit is moved, a reading unit capable of reading an information medium, and a control unit. The chuck table includes an information medium on which identifying information distinguishing the chuck table is recorded. The reading unit reads the information medium of the chuck table installed in the processing apparatus. The control unit includes a height data recording section configured to record the height data and the identifying information in association with each other, and a processing control section configured to control a height of the processing unit during processing on a basis of the height data associated with the identifying information read by the reading unit.

In accordance with another aspect of the present invention, there is provided a processing apparatus including a chuck table having a holding surface configured to hold a workpiece and a frame body surrounding the holding surface, a processing unit configured to process the workpiece held on the chuck table, a moving unit configured to move the chuck table and the processing unit relative to each other in an X-axis direction parallel with the holding surface and a Y-axis direction orthogonal to the X-axis direction, a height measuring unit fitted to the processing unit, the height measuring unit measuring, as height data, heights (Z) at a plurality of coordinates (X, Y) of the holding surface measured while the moving unit is moved, a reading unit capable of reading an information medium, and a control unit. The chuck table includes an information medium on which the height data of the chuck table is recorded, and the control unit includes a processing control section configured to control a height of the processing unit during processing on a basis of the height data read by the reading unit.

Preferably, the information medium is formed by a two-dimensional code or a radio frequency (RF) tag of radio frequency identification (RFID) in which information can be written and read by wireless communication.

In accordance with a further aspect of the present invention, there is provided a chuck table including a holding surface, a frame body surrounding the holding surface, and an information medium configured to record height data obtained by measuring heights at a plurality of coordinates of the holding surface in a state in which the chuck table is installed in a processing apparatus.

Preferably, the information medium is formed by a two-dimensional code or an RFID RF tag in which information can be written and read by wireless communication.

The present invention produces an effect of being able to prevent a decrease in processing quality of a workpiece which may be attendant on chuck table replacement.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail with reference to the drawings. The present invention is not limited by contents described in the following embodiments. In addition, constituent elements described in the following include constituent elements readily conceivable by those skilled in the art and essentially identical constituent elements. Further, configurations to be described in the following can be combined with each other as appropriate. In addition, various omissions, replacements, or modifications of configurations can be performed without departing from the spirit of the present invention.

In addition, in the embodiments of the present invention, when a plurality of constituent elements having an essentially identical functional configuration do not particularly need to be distinguished from each other, the constituent elements may be described with an identical reference sign assigned thereto. In addition, a plurality of constituent elements having an essentially identical functional configuration may be distinguished from each other by assigning different numbers, characters, or the like following an identical reference sign.

In the embodiments to be described in the following, an XYZ orthogonal coordinate system is set, and positional relation of each part will be described with reference to the XYZ orthogonal coordinate system. One direction in a horizontal plane is set as an X-axis direction, a direction orthogonal to the X-axis direction in the horizontal plane is set as a Y-axis direction, and a direction orthogonal to each of the X-axis direction and the Y-axis direction is set as a Z-axis direction. An XY plane including an X-axis and a Y-axis is parallel with the horizontal plane. The Z-axis direction orthogonal to the XY plane is a vertical direction.

First Embodiment

Figure 1:
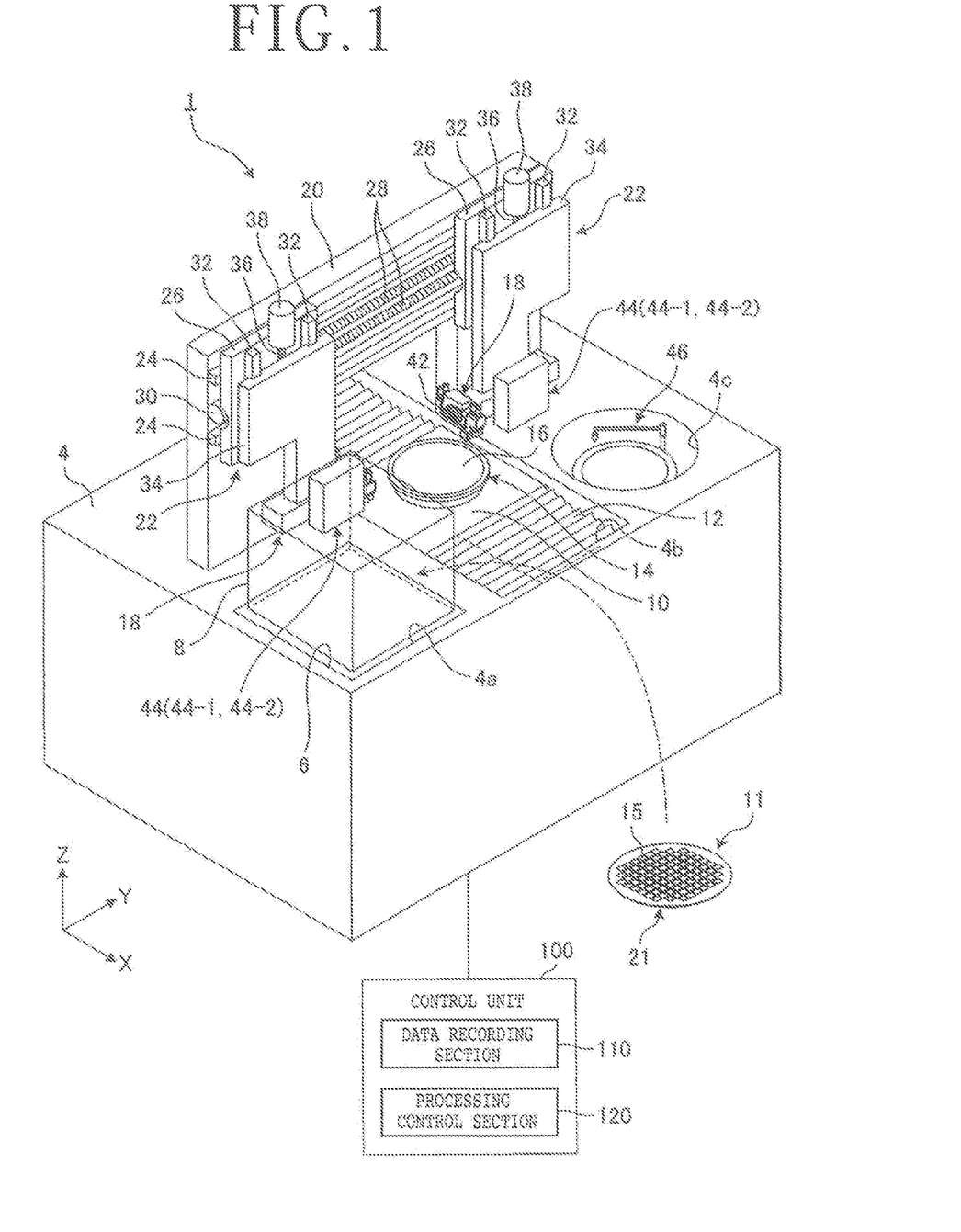
FIG. 1 is a perspective view illustrating an external configuration of a processing apparatus according to a first embodiment.
Figure 2:
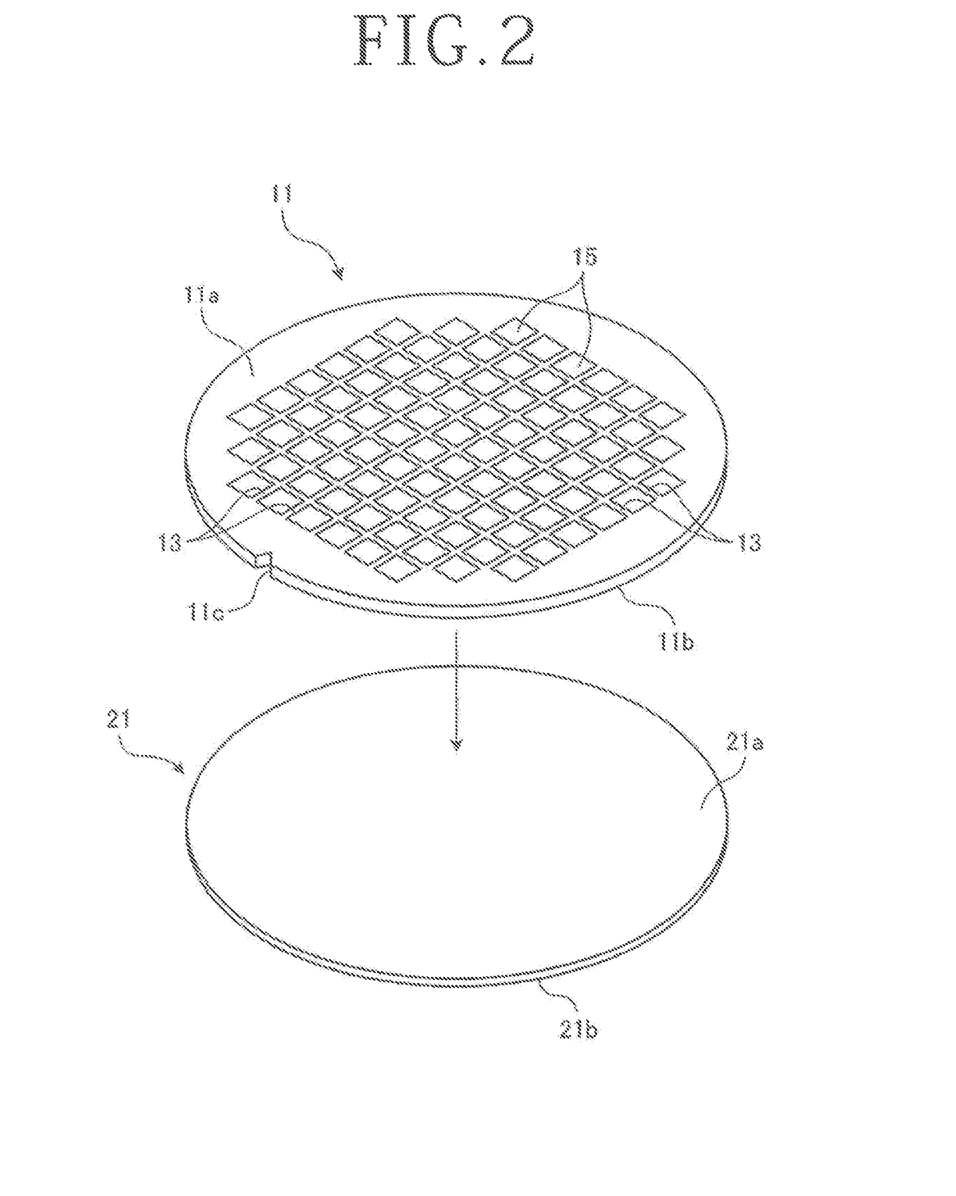
FIG. 2 is a perspective view illustrating an external configuration of a workpiece according to the first embodiment.

FIG. 1 is a perspective view illustrating an external configuration of a processing apparatus according to a first embodiment. FIG. 2 is a perspective view illustrating an external configuration of a workpiece according to the first embodiment. A processing apparatus 1 illustrated in FIG. 1 is an apparatus that holds a workpiece 11 by a chuck table 14 and cuts the workpiece 11 by a cutting blade 42.

The workpiece 11 illustrated in FIG. 2 is a disk-shaped wafer such as a semiconductor wafer or an optical device wafer that includes silicon, sapphire, gallium, or the like as a base material. A top surface 11a of the workpiece 11 is provided with a functional layer of a metallic film serving as wiring, an insulating film providing insulation between pieces of wiring, and the like.

In addition, the top surface 11a of the workpiece 11 is demarcated into a plurality of regions by planned dividing lines 13 arranged in a lattice manner. A device 15 such as an integrated circuit (IC) or a large-scale integrated circuit (LSI) is formed in each region. In addition, a notch 11c serving as a mark when the orientation of the workpiece 11 (crystal orientation) is determined is provided to an outer edge portion of the workpiece 11. However, an orientation flat may be provided in place of the notch 11c. In addition, when the orientation of the workpiece 11 is determined on the basis of a pattern of devices 15 or the like, the notch 11c does not need to be provided.

The material, shape, structure, and the like of the workpiece 11 do not particularly need to be limited. A substrate formed of a material such as a ceramic, a metal, or a resin can also be used as the workpiece 11. The kind, quantity, arrangement, and the like of the devices 15 do not particularly need to be limited.

As illustrated in FIG. 2, a protective member 21 is affixed to an undersurface 11b of the workpiece 11. The protective member 21 is formed by a circular film (tape) having a diameter equal to that of the workpiece 11. A top surface 21a of the protective member 21 is provided with a glue layer having an adhesive force. The protective member 21 is affixed to the workpiece 11 by making the top surface 21a side of the protective member 21 provided with such a glue layer abut against the undersurface 11b of the workpiece 11. Incidentally, the protective member 21 may be a member formed by only a base material layer of a synthetic resin and affixed to the workpiece 11 by thermocompression bonding. In addition, the workpiece 11 may be affixed to an opening of an annular frame via the protective member 21.

The processing apparatus 1 includes a base 4 that supports each structure. A cassette support 6 that is raised and lowered is provided within a rectangular opening 4a formed in a front corner portion of the base 4. The cassette support 6 has a mounting surface on which a cassette 8 capable of housing a plurality of workpieces 11 can be mounted.

An X-axis moving table 10 moved in the X-axis direction by an X-axis moving unit not illustrated (an example of a moving unit) and a dustproof cover 12 are provided within a long rectangular opening 4b formed in a processing feed direction (X-axis direction) on a side of the cassette support 6.

The X-axis moving unit includes a pair of X-axis guide rails not illustrated which is parallel with the X-axis direction. The X-axis moving table 10 is slidably attached to the X-axis guide rails. A nut portion not illustrated is provided to the undersurface of the X-axis moving table 10. An X-axis ball screw not illustrated which is parallel with the X-axis guide rails is screwed into such a nut portion. An X-axis motor not illustrated is coupled to one end portion of the X-axis ball screw. The X-axis moving table 10 is moved along the X-axis guide rails by rotating the X-axis ball screw by the X-axis motor. The chuck table 14 for holding the workpiece 11 is disposed on the X-axis moving table 10.

Figure 3:
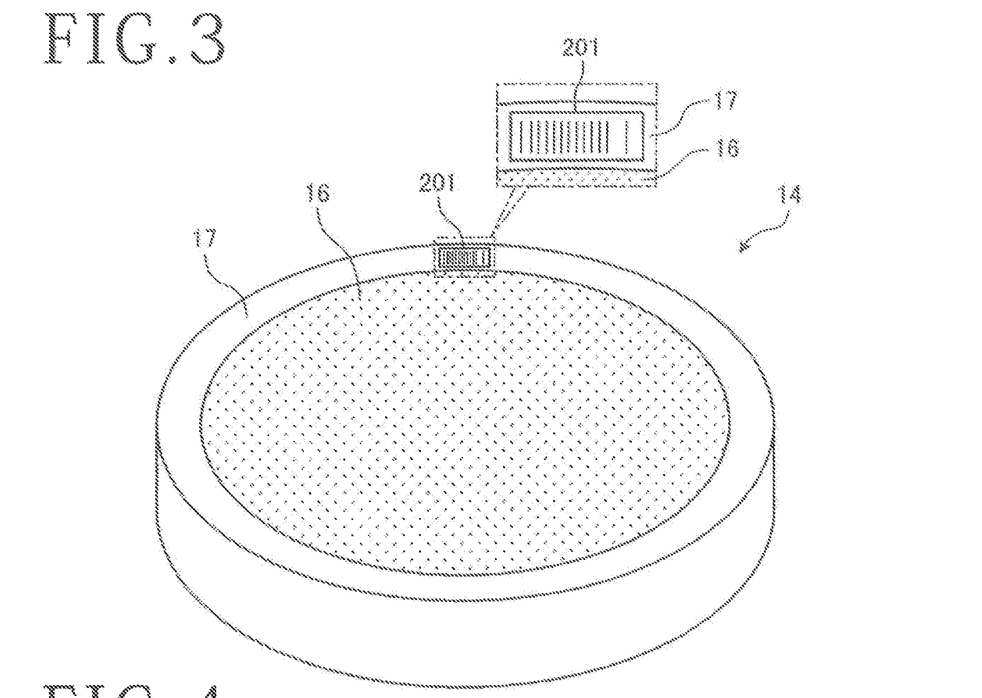
FIG. 3 is a perspective view schematically illustrating an example of a configuration of a chuck table according to the first embodiment.

FIG. 3 is a diagram schematically illustrating an example of a configuration of the chuck table according to the first embodiment. As illustrated in FIG. 3, the chuck table 14 has a disk shape and includes a holding surface 16 for holding the workpiece 11, the holding surface 16 being formed of a porous ceramic or the like, and a frame body 17 surrounding the holding surface 16. In addition, a two-dimensional bar code 201 (an example of an information medium) that records a table ID (an example of identifying information) distinguishing the chuck table 14 is provided on the upper surface of the frame body 17. The table ID is information uniquely assigned to each of a plurality of chuck tables to be installed in the processing apparatus 1.

In addition, the chuck table 14 is disposed so as to be movable by the X-axis moving unit in the X-axis direction between a processing region below a processing unit 18 and a loading and unloading region that is separated from the region below the processing unit 18 and in which the workpiece 11 is loaded and unloaded. The chuck table 14 is disposed so as to be rotatable about an axis parallel with the Z-axis direction by a rotation driving source such as a motor not illustrated. The chuck table 14 is connected to a vacuum suction source not illustrated. The chuck table 14 sucks and holds the workpiece 11 mounted on the holding surface 16 by being sucked by the vacuum suction source.

A gate-shaped supporting structure 20 that supports two sets of processing units 18 is disposed on the upper surface of the base 4 so as to straddle the opening 4b. A front upper portion of the supporting structure 20 is provided with two sets of processing unit moving mechanisms 22 (an example of a moving unit) that move the respective processing units 18 in an indexing feed direction (Y-axis direction) and a cutting feed direction (Z-axis direction).

The processing unit moving mechanisms 22 share a pair of Y-axis guide rails 24 that is arranged on the front surface of the supporting structure 20 and is parallel with the Y-axis direction. Respective Y-axis moving plates 26 are attached to the pair of Y-axis guide rails 24 so as to be slidable in the Y-axis direction. A nut portion not illustrated is provided to the undersurface of each Y-axis moving plate 26. Y-axis ball screws 28 parallel with the Y-axis guide rails 24 are screwed into the respective nut portions. The respective Y-axis moving plates 26 are moved along the Y-axis guide rails 24 by rotating the Y-axis ball screws 28 by Y-axis motors 30 coupled to one end portions of the respective Y-axis ball screws 28.

A pair of Z-axis guide rails 32 parallel with the Z-axis direction is provided to the front surface of each of the Y-axis moving plates 26. A Z-axis moving plate 34 is attached to each pair of Z-axis guide rails 32 so as to be slidable in the Z-axis direction. A nut portion not illustrated is provided to the back surface of each Z-axis moving plate 34. A Z-axis ball screw 36 parallel with the Z-axis guide rails 32 is screwed into each such nut portion. The respective Z-axis moving plates 34 are moved along the corresponding pairs of Z-axis guide rails 32 by rotating the Z-axis ball screws 36 by Z-axis motors 38 coupled to one end portions of the respective Z-axis ball screws 36.

The processing units 18 (an example of a processing unit) are provided to lower portions of the respective Z-axis moving plates 34. The processing apparatus 1 illustrated in FIG. 1 is what is called a facing dual type apparatus having two processing units 18, that is, a twin spindle dicer.

Each of the processing units 18 processes a workpiece 11 held on the chuck table 14. Each of the processing units 18 has an annular cutting blade 42 for cutting the workpiece 11. The cutting blade 42 is detachably mounted on one end portion of a spindle 40.

A composite measuring unit 44 is fitted to each of the processing units 18. The composite measuring unit 44 is formed as a composite unit integrally including a height measuring unit 44-1 (an example of a height measuring unit) for measuring the height of the holding surface 16 of the chuck table 14 and an imaging unit 44-2 (reading unit) for imaging the workpiece 11 or the like.

The height measuring unit 44-1 is, for example, implemented by a laser displacement gage that measures the height of a target by using a laser beam L1. The height measuring unit 44-1 can measure the height of the holding surface 16 of the chuck table 14 in a noncontact manner. The height measuring unit 44-1 is fitted to the processing unit 18 and measures, as height data, heights (Z) at a plurality of coordinates (X, Y) of the holding surface 16 measured while the X-axis moving unit and each of the processing unit moving mechanisms 22 are moved.

The imaging unit 44-2 (an example of a reading unit) is, for example, implemented by a camera including a charge-coupled device (CCD) imaging element or a complementary MOS (CMOS) imaging element. The imaging unit 44-2 photographs the workpiece 11 held on the chuck table 14, thereby obtains an image for carrying out alignment that performs positioning between the workpiece 11 and the cutting blade 42, for example, and then outputs the obtained image to a control unit 100.

In addition, the imaging unit 44-2 has a function of reading information recorded in the two-dimensional bar code 201 provided to the chuck table 14. The imaging unit 44-2 sends a table ID read from the two-dimensional bar code, the table ID distinguishing the chuck table, to the control unit 100.

The X-axis moving unit and the respective processing unit moving mechanisms 22 move the chuck table 14 and the processing units 18 relative to each other in the X-axis direction and the Y-axis direction parallel with the holding surface 16. That is, the chuck table 14 and the processing units 18 are processing-fed relative to each other along the X-axis direction by moving the chuck table 14 in the X-axis direction as a processing feed direction by the X-axis moving unit. In addition, the processing units 18 and the composite measuring units 44 are indexing-fed in the Y-axis direction by moving the Y-axis moving plates 26 in the Y-axis direction by the respective processing unit moving mechanisms 22. Incidentally, the processing units 18 and the composite measuring units 44 are cutting-fed in the Z-axis direction by moving the Z-axis moving plates 34 in the Z-axis direction by the respective processing unit moving mechanisms 22.

A cleaning unit 46 is provided within an opening 4c of the base 4. The cleaning unit 46 cleans workpieces 11 after cutting or the like. Constituent elements of the processing apparatus 1, that is, the X-axis moving unit not illustrated, the chuck table 14, the processing units 18, the processing unit moving mechanisms 22, the composite measuring units 44, and the cleaning unit 46 are each connected to the control unit 100.

The control unit 100 (an example of a control unit) includes an arithmetic processing apparatus such as a central processing unit (CPU), a storage apparatus such as a read only memory (ROM) or a random access memory (RAM), and an input-output interface apparatus. The control unit 100 is a computer capable of, in order to perform various kinds of processing to be described in the following by each such part, executing a computer program for controlling each constituent element described above or the like.

As illustrated in FIG. 1, the control unit 100 includes a data recording section 110 and a processing control section 120. The control unit 100 implements or performs the functions and actions of various kinds of processing of the processing apparatus 1 according to the first embodiment by each such section. The sections of the control unit 100 are, for example, implemented by functions provided by a program stored in the storage apparatus. That is, the sections of the control unit 100 are implemented by the arithmetic processing apparatus by executing the program stored in the storage apparatus with the RAM or the like used as a work area. The functional configuration of the control unit 100 does not particularly need to be limited to the configuration example illustrated in FIG. 1 and may be another configuration as long as the configuration can perform the various kinds of processing in the processing apparatus 1, which will be described later.

[Outline of Processing]

Figure 4:
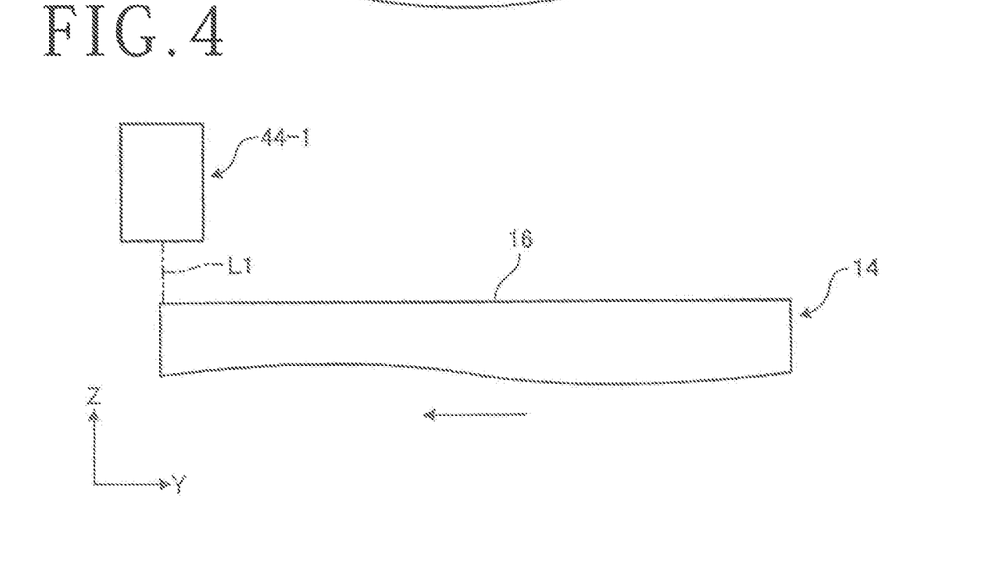
FIG. 4 is a side view illustrating positional relation between the chuck table according to the first embodiment and a height measuring unit.
Figure 5:
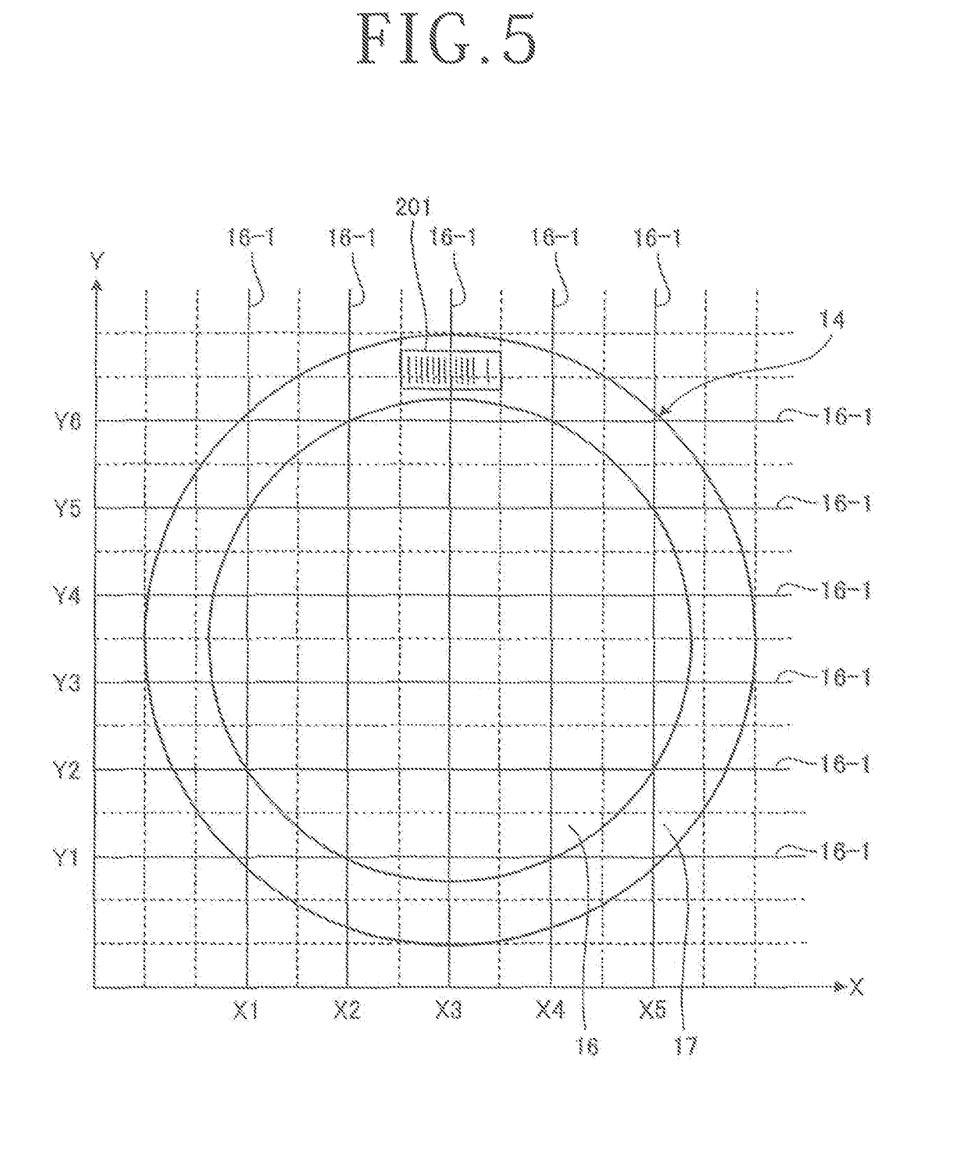
FIG. 5 is a diagram illustrating an example of setting measurement lines according to the first embodiment.
Figure 6:
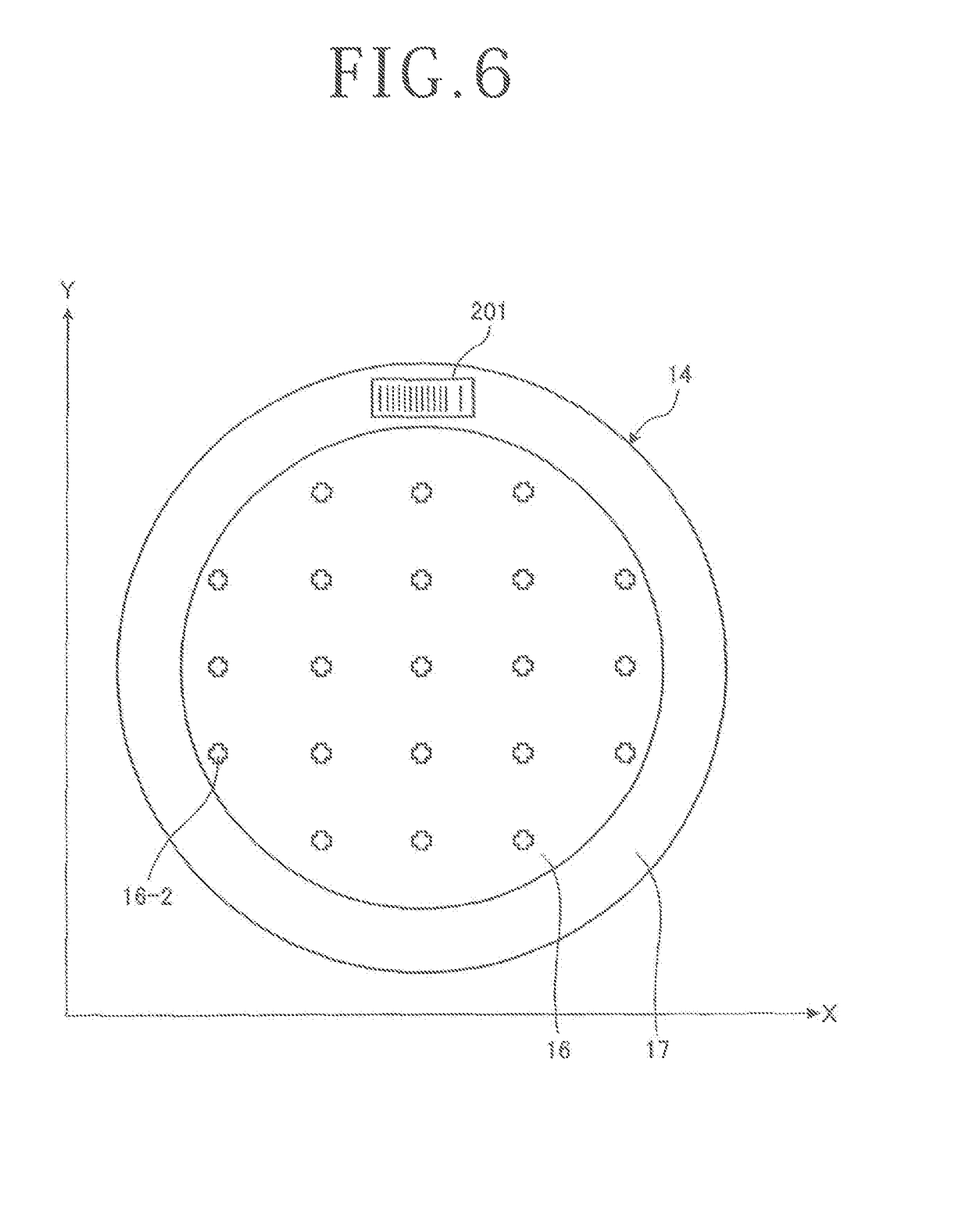
FIG. 6 is a diagram illustrating an example of setting measurement points according to the first embodiment.

The control unit 100 performs height measurement processing that measures the height of the holding surface 16 of the chuck table 14 by the height measuring unit 44-1 of a composite measuring unit 44. FIG. 4 is a side view illustrating positional relation between the chuck table according to the first embodiment and the height measuring unit. FIG. 5 is a diagram illustrating an example of setting measurement lines according to the first embodiment. FIG. 6 is a diagram illustrating an example of setting measurement points according to the first embodiment.

As illustrated in FIG. 4, the data recording section 110 of the control unit 100 positions the imaging unit 44-2 of the composite measuring unit 44 above the chuck table 14 installed in the processing apparatus 1. The data recording section 110 next makes the imaging unit 44-2 read the two-dimensional bar code 201 provided on the frame body 17 of the chuck table 14. The data recording section 110 then obtains a table ID read by the imaging unit 44-2.

Following this, the data recording section 110 moves the height measuring unit 44-1 to a position above the holding surface 16 of the chuck table 14 by moving the chuck table 14 and the height measuring unit 44-1 relative to each other. The data recording section 110 next positions the height measuring unit 44-1 at a position at which the laser beam L1 for measurement which is applied from the height measuring unit 44-1 can irradiate a measurement line 16-1 (FIG. 5) set in advance in the holding surface 16. The data recording section 110 then performs the height measurement processing by applying the laser beam L1 for measurement along a plurality of measurement lines 16-1 (FIG. 5) in order while moving the chuck table 14 and the height measuring unit 44-1 relative to each other. The data recording section 110 can thereby measure heights (Z) at a plurality of coordinates (X, Y) of the holding surface 16 of the chuck table 14. The data recording section 110 can record data indicating correlation between the plurality of coordinates (X, Y) and the heights (Z) at the plurality of coordinates (X, Y), the data being obtained as a result of the measurement, as height data. Incidentally, the height measuring unit 44-1 is not limited to a laser irradiation type sensor, but another measuring unit using a back pressure sensor, a contact type sensor, or the like can also be implemented as the height measuring unit 44-1.

As illustrated in FIG. 5, the plurality of measurement lines 16-1 are set to the holding surface 16 at a predetermined pitch (interval) in the X-axis direction and the Y-axis direction in advance. Information regarding the heights (Z) at the plurality of coordinates (X, Y) in the holding surface 16 is obtained by performing height measurement along the measurement lines 16-1. The plurality of measurement lines 16-1 can be set to the holding surface 16 at a pitch of 20 to 50 mm, for example. Incidentally, the number, pitch, and arrangement positions of the measurement lines 16-1 set to the holding surface 16 are not particularly limited and can be changed to any number, pitch, and arrangement position by an operator.

In addition, the data recording section 110 does not particularly need to be limited to the example of performing height measurement along the measurement lines 16-1. As illustrated in FIG. 6, a plurality of measurement points 16-2 may be set to the holding surface 16 in advance, and height measurement may be performed at each measurement point 16-2.

Figure 7:
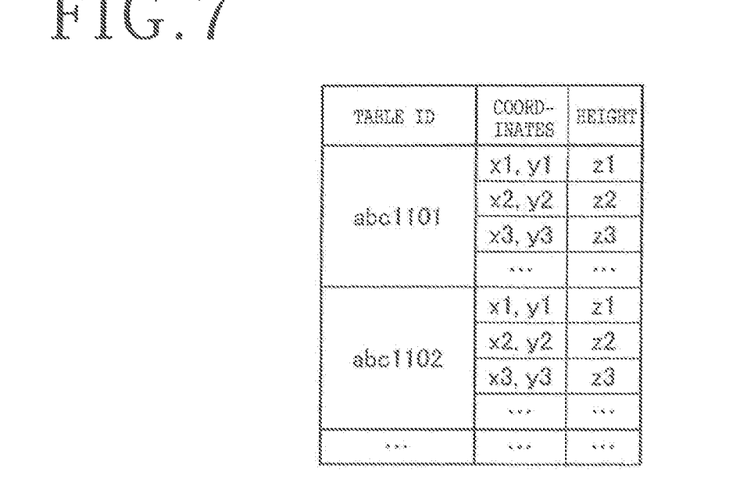
FIG. 7 is a diagram illustrating an outline of height data according to the first embodiment.

The data recording section 110 records height data obtained by the above-described height measurement processing and the table ID of the chuck table 14 in association with each other. FIG. 7 is a diagram illustrating an outline of the height data according to the first embodiment. As illustrated in FIG. 7, the height data recorded by the data recording section 110 includes respective items of a table ID, coordinates, and a height, and the items are associated with each other. As the item of the table ID, the table ID of the chuck table 14 which is read by the imaging unit 44-2 is stored. As the item of the coordinates, the value of coordinates (X, Y) of the holding surface 16 in the height measurement processing is stored. As the item of the height, the value of a height (Z) of the holding surface 16 in the height measurement processing is stored.

Figure 8:
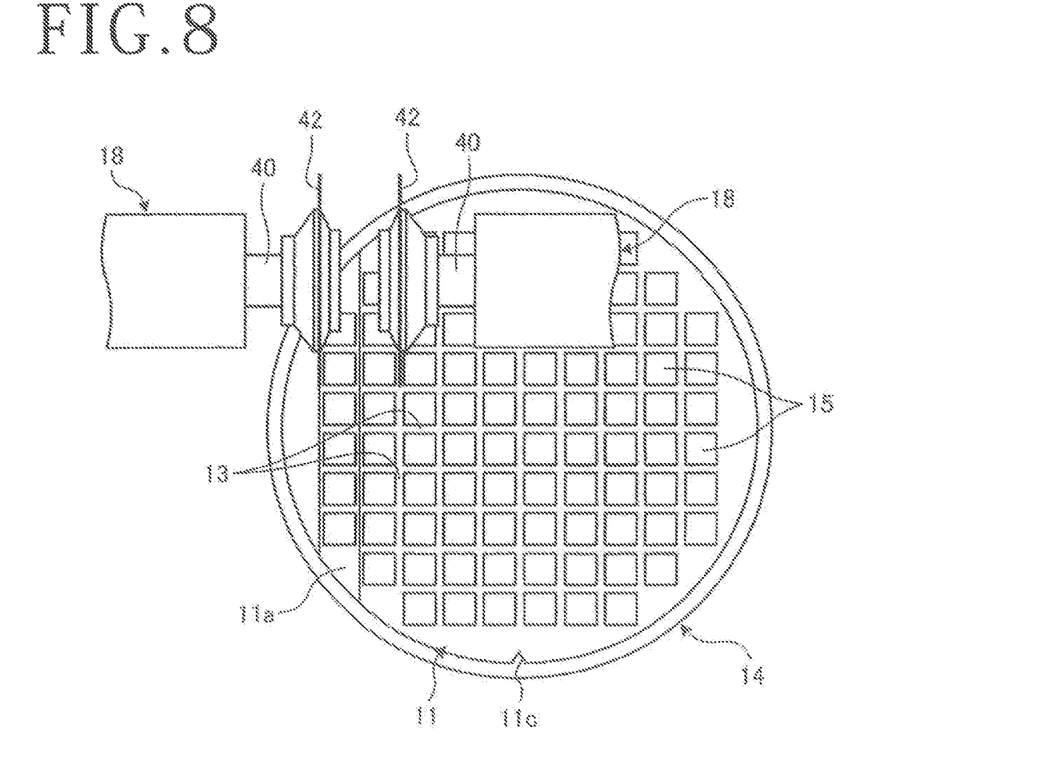
FIG. 8 is a plan view schematically illustrating processing control according to the first embodiment.

The processing control section 120 of the control unit 100 controls the height of the processing units 18 during processing on the basis of the height data recorded in the data recording section 110. That is, the processing control section 120 obtains the height data associated with the table ID read by the imaging unit 44-2 from the data recording section 110, and controls the height of the processing units 18 during processing on the basis of the obtained height data. FIG. 8 is a plan view schematically illustrating processing control according to the first embodiment. As illustrated in FIG. 8, the processing control section 120 forms a cut groove to a desired depth of the workpiece 11 by making the cutting blade 42 cut into the workpiece 11 on the basis of the height data.

[Processing Procedure]

Figure 9:
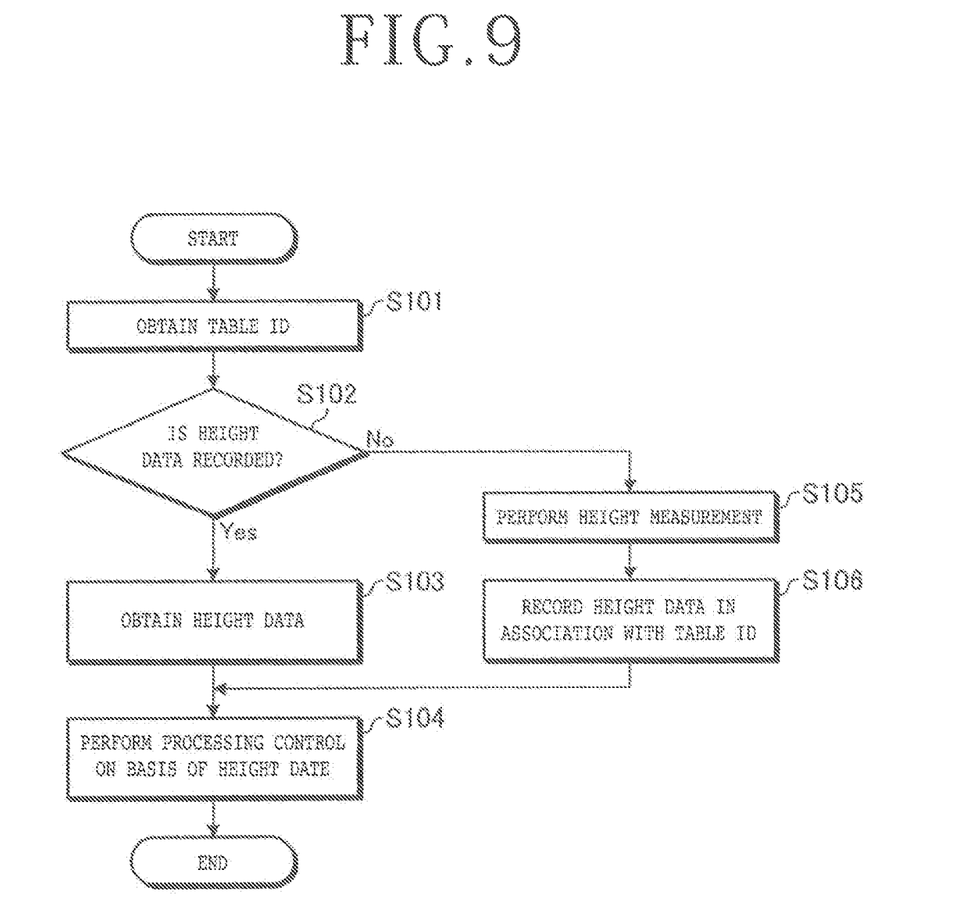
FIG. 9 is a flowchart illustrating an example of a processing procedure of the processing apparatus according to the first embodiment.

An example of a procedure for processing of the processing apparatus according to the first embodiment will be described with reference to FIG. 9. FIG. 9 is a flowchart illustrating an example of the processing procedure of the processing apparatus according to the first embodiment. The processing illustrated in FIG. 9 is performed by the sections included in the control unit 100.

As illustrated in FIG. 9, the data recording section 110 obtains the table ID of the chuck table 14 from the imaging unit 44-2 (step S101). The data recording section 110 next determines whether or not the height data of the holding surface 16 of the chuck table 14 which is associated with the table ID is recorded (step S102).

When the data recording section 110 determines that the height data associated with the table ID is recorded (step S102; Yes), the data recording section 110 obtains the height data associated with the table ID (step S103). The processing control section 120 performs processing control on the basis of the height data obtained by the data recording section 110 (step S104), and then ends the processing illustrated in FIG. 9.

When the data recording section 110 determines in the above-described step S102 that the height data associated with the table ID is not recorded (step S102; No), the data recording section 110 measures the height of the holding surface 16 of the chuck table 14 (step S105). Alternatively, when it is determined that the height data associated with the table ID is not recorded, the processing control section 120 may perform control so as to process the workpiece 11 by cutting into the workpiece 11 by the cutting blade 42 to a fixed height from the holding surface 16 without using the height data, as is conventional.

Next, the data recording section 110 records the height data obtained by the measurement in step S105 in association with the table ID obtained in step S101 (step S106), and proceeds to the processing procedure of the above-described step S104. That is, the processing control section 120 performs processing control on the basis of the height data obtained by the data recording section 110.

As described above, the processing apparatus 1 according to the first embodiment includes the chuck table 14, the processing units 18, the X-axis moving unit (not illustrated), the processing unit moving mechanisms 22, the height measuring units 44-1, the imaging units 44-2, and the control unit 100. The chuck table 14 has the holding surface 16 for holding the workpiece 11 and the frame body 17 surrounding the holding surface 16, and includes the two-dimensional bar code 201 (an example of an information medium) that records identifying information distinguishing the chuck table 14. The processing units 18 (an example of a processing unit) process the workpiece 11 held on the chuck table 14. The X-axis moving unit (not illustrated) and the processing unit moving mechanisms 22 (an example of a moving unit) move the chuck table 14 and the processing units 18 relative to each other in the X-axis direction and the Y-axis direction parallel with the holding surface 16.

Each of the height measuring units 44-1 (an example of a height measuring unit) is fitted to the processing unit 18 and measures, as height data, the plurality of coordinates (X, Y) of the holding surface 16 measured while the X-axis moving unit (not illustrated) and the processing unit moving mechanism 22 are moved and the heights (Z) at the plurality of coordinates (X, Y). Each of the imaging units 44-2 (an example of a height measuring unit) can read the two-dimensional bar code 201. That is, the imaging unit 44-2 can obtain the table ID by reading the two-dimensional bar code 201. The control unit 100 (an example of a control unit) includes the data recording section 110 and the processing control section 120. The data recording section 110 (an example of height data recording section) records the height data and the table ID in association with each other. The processing control section 120 controls the height of the processing units 18 during processing on the basis of the height data associated with the table ID read by the imaging unit 44-2. Thus, even when the chuck table 14 is substituted, the processing apparatus 1 according to the first embodiment can perform processing control on the basis of the height data corresponding to the chuck table 14. The processing apparatus 1 according to the first embodiment can therefore prevent a decrease in processing quality of the workpiece 11 as the chuck table 14 is substituted.

[Modification]

Figure 10:
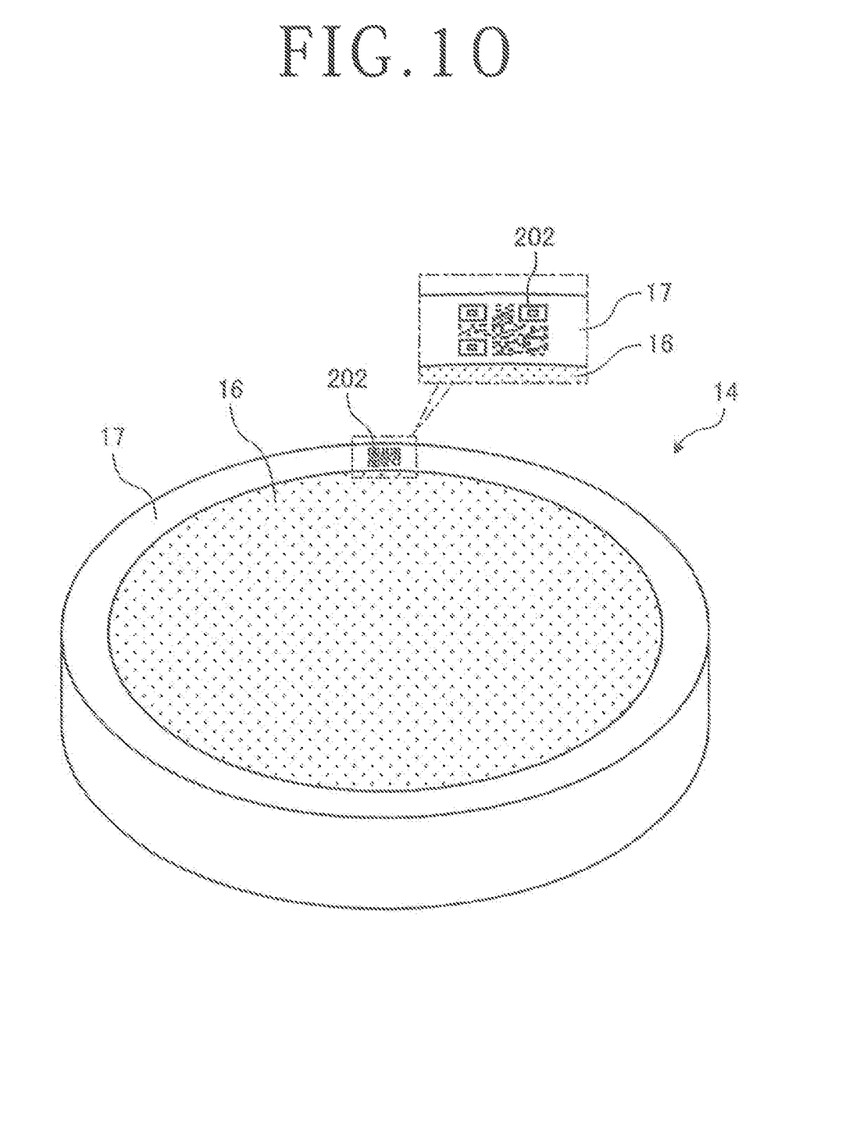
FIG. 10 is a perspective view schematically illustrating an example of a configuration of a chuck table according to a modification.

In the foregoing first embodiment, description has been made of an example in which the two-dimensional bar code 201 is used as an information medium recording the table ID (identifying information) of the chuck table 14. However, the information medium does not particularly need to be limited to the example. FIG. 10 is a diagram schematically illustrating an example of a configuration of a chuck table according to a modification. As illustrated in FIG. 10, a two-dimensional code 202 (an example of an information medium) that records the table ID (an example of identifying information) distinguishing the chuck table 14 may be provided on the upper surface of the frame body 17 surrounding the holding surface 16 of the chuck table 14. In this case, the imaging unit 44-2 has a function of reading information recorded in the two-dimensional code 202 provided to the chuck table 14, and sends the table ID read from the two-dimensional code 202 to the control unit 100. The two-dimensional code 202 is referred to as a matrix type two-dimensional code. The two-dimensional code 202 includes a quick response code (QR code: registered trademark).

Second Embodiment

Figure 11:
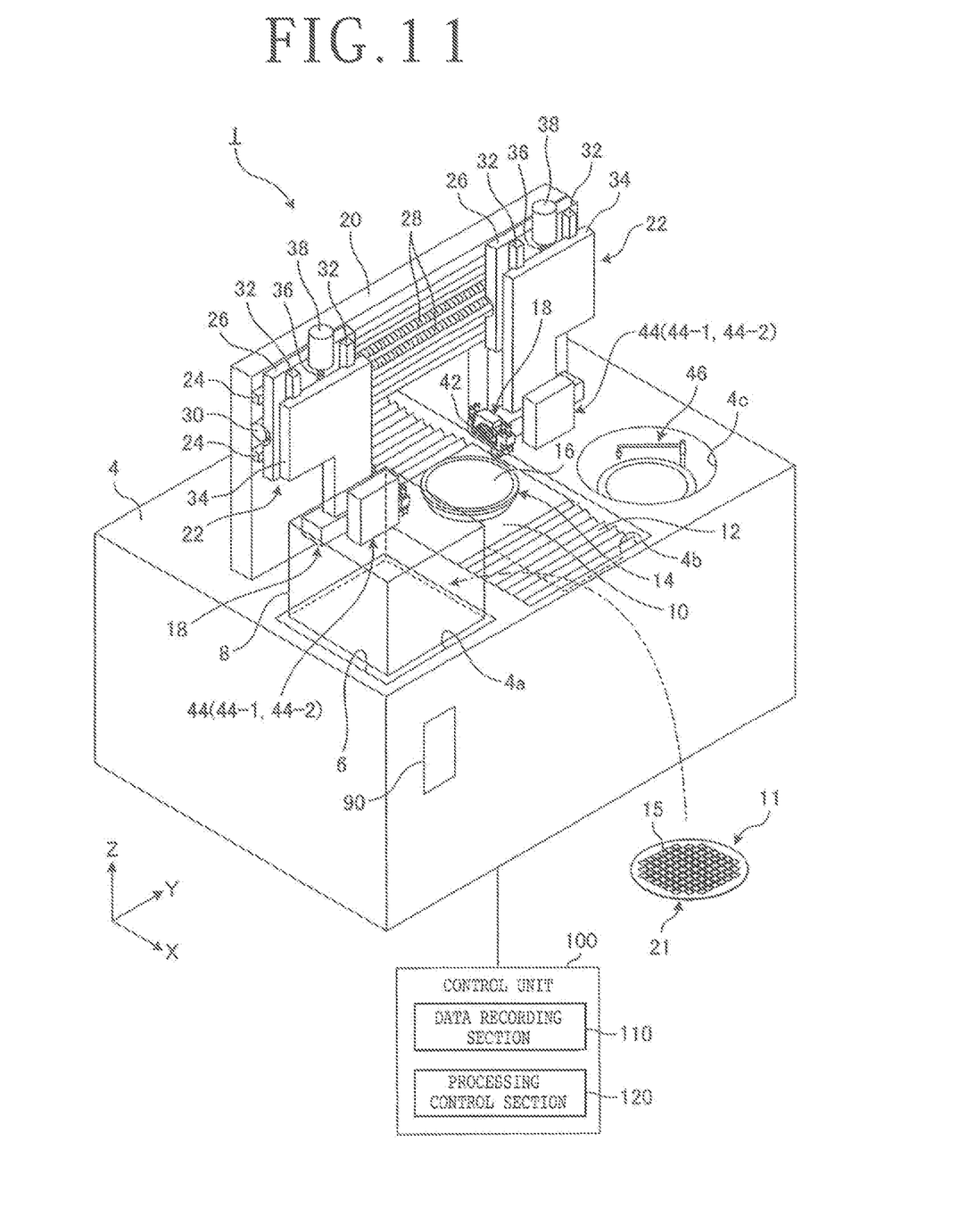
FIG. 11 is a perspective view illustrating an external configuration of a processing apparatus according to a second embodiment.
Figure 12:
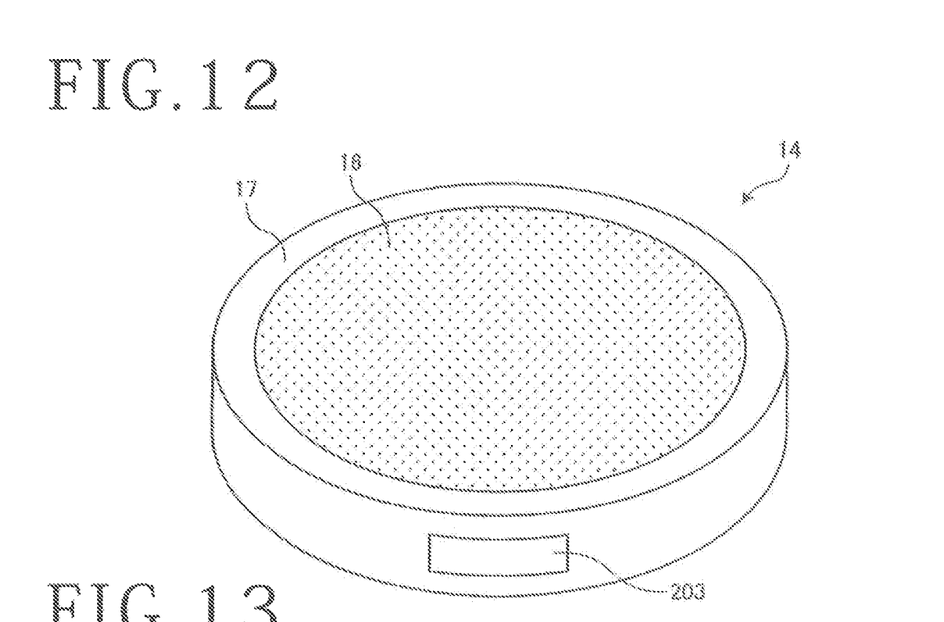
FIG. 12 is a perspective view schematically illustrating an example of a configuration of a chuck table according to the second embodiment.
Figure 13:
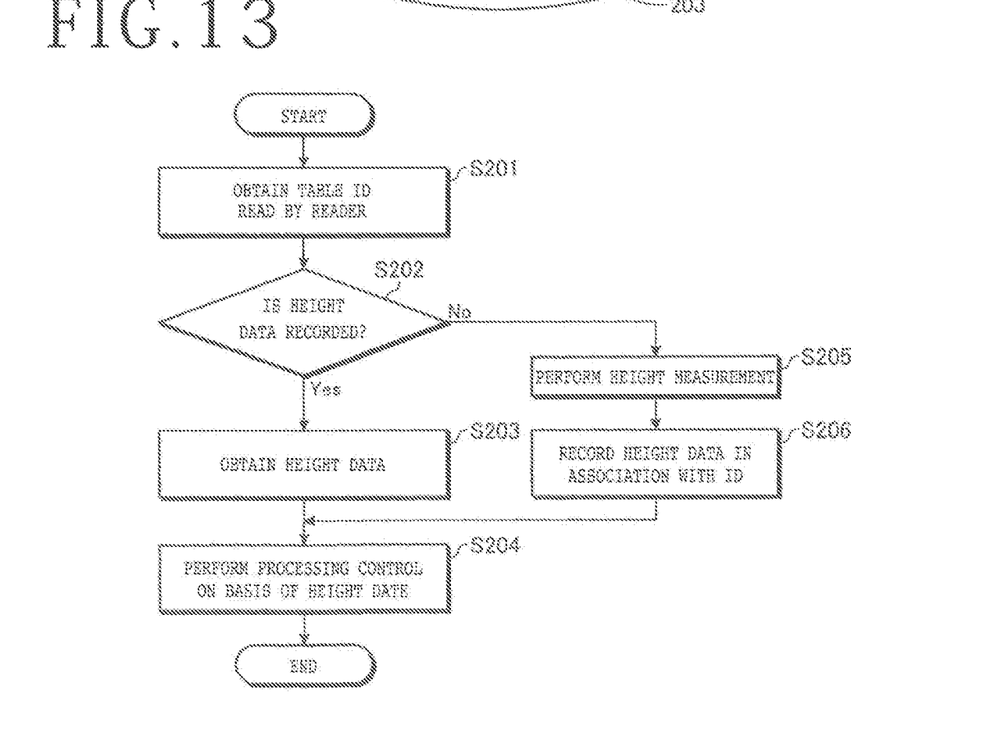
FIG. 13 is a flowchart illustrating an example of a processing procedure of the processing apparatus according to the second embodiment.

In the foregoing first embodiment, description has been made of an example in which the two-dimensional bar code 201 and the two-dimensional code 202 are used as the information medium that records the table ID of the chuck table 14. However, there is no need for particular limitation to the present example, and an RF tag supporting RFID may be used as the information medium recording the table ID of the chuck table 14. In the following, a processing apparatus according to a second embodiment will be described with reference to FIGS. 11 to 13. FIG. 11 is a perspective view illustrating an external configuration of the processing apparatus according to the second embodiment. FIG. 12 is a diagram schematically illustrating an example of a configuration of a chuck table according to the second embodiment. FIG. 13 is a flowchart illustrating an example of a processing procedure of the processing apparatus according to the second embodiment.

As illustrated in FIG. 12, an RF tag 203 (an example of an information medium) that records the table ID of the chuck table 14 is provided on the frame body 17 surrounding the holding surface 16 of the chuck table 14. Incidentally, the RF tag 203 may not be exposed on the surface of the frame body 17 and may be housed within the chuck table 14.

As illustrated in FIG. 11, the processing apparatus 2 according to the second embodiment includes a reader 90 (an example of a reading unit). The reader 90 is, for example, an RFID apparatus capable of writing and reading information by wireless communication. The reader 90 reads the table ID of the chuck table 14 from the RF tag 203 provided to the chuck table 14 illustrated in FIG. 12. The reader 90 can communicate by wireless or by wire. The reader 90 sends the table ID read from the RF tag 203 to the control unit 100.

[Processing Procedure]

An example of a procedure for processing of the processing apparatus according to the second embodiment will be described with reference to FIG. 13. The processing illustrated in FIG. 13 is performed by the sections included in the control unit 100. Incidentally, the processing procedure illustrated in FIG. 13 is different from the processing procedure illustrated in FIG. 9 in terms of the procedure of step S201.

As illustrated in FIG. 13, the data recording section 110 obtains the table ID of the chuck table 14 which is read by the reader 90 (step S201). The data recording section 110 next determines whether or not the height data of the holding surface 16 of the chuck table 14 which is associated with the table ID obtained in step S201 is recorded (step S202).

When the data recording section 110 determines that the height data associated with the table ID is recorded (step S202; Yes), the data recording section 110 obtains the height data associated with the table ID (step S203). The processing control section 120 performs processing control on the basis of the height data obtained by the data recording section 110 (step S204), and then ends the processing illustrated in FIG. 13.

When the data recording section 110 determines in the above-described step S202 that the height data associated with the table ID obtained in step S201 is not recorded (step S202; No), the data recording section 110 measures the height of the holding surface 16 of the chuck table 14 (step S205). Alternatively, when it is determined that the height data associated with the table ID is not recorded, the processing control section 120 may perform control so as to process the workpiece 11 by cutting into the workpiece 11 by the cutting blade 42 to a fixed height from the holding surface 16 without using the height data, as is conventional.

Next, the data recording section 110 records the height data obtained by the measurement in step S205 in association with the table ID obtained in step S201 (step S206), and proceeds to the processing procedure of the above-described step S204. That is, the processing control section 120 performs processing control on the basis of the height data obtained by the data recording section 110.

Third Embodiment

In the foregoing embodiments, description has been made of an example in which the processing apparatus 1 reads the table ID from the information medium such as the two-dimensional bar code 201, the two-dimensional code 202, or the RF tag 203, and performs processing control on the basis of the height data associated with the read table ID. However, there is no need for particular limitation to the example. For example, in place of the table ID, the height data of the holding surface 16 of the chuck table 14 may be recorded on the information media. The processing apparatus 1 can thereby perform processing control directly using the height data read from the information media.

For example, in a case where the two-dimensional bar code 201 or the two-dimensional code 202 is used, the operator installs the chuck table 14 in the processing apparatus 1 and performs the height measurement processing for the chuck table 14 before using the chuck table 14. Then, the operator generates the two-dimensional bar code 201 or the two-dimensional code 202 recording the height data obtained by the height measurement processing and installs, in advance, the generated two-dimensional bar code 201 or the generated two-dimensional code 202 on the chuck table 14 before usage. The processing control section 120 of the control unit 100 makes the imaging unit 44-2 of the composite measuring unit 44 read the two-dimensional bar code 201 or the two-dimensional code 202 provided to the frame body 17 of the chuck table 14. The processing control section 120 obtains the height data read by the imaging unit 44-2 and performs processing control using the obtained height data.

In addition, in a case where the RF tag 203 is used, the operator installs the chuck table 14 in the processing apparatus 1 and performs the height measurement processing for the chuck table 14 before using the chuck table 14. The operator writes the height data obtained by the height measurement processing to the RF tag 203 by using a writer supporting RFID and installs, in advance, the RF tag 203 having the height data written thereon on the chuck table 14 before usage. The processing control section 120 of the control unit 100 obtains the height data read from the RF tag 203 by the reader 90 from the reader 90 and performs processing control using the obtained height data.

Thus, according to the third embodiment, the processing apparatus 1 can directly obtain the height data recorded on the information medium of the chuck table 14 and perform processing control, without the trouble of recording the height data associated with the table ID in the data recording section 110.

In addition, in the foregoing embodiment, at least one of the table ID and the height data of the chuck table 14 may be recorded on an information medium. In a case where only the table ID is recorded on the information medium, the processing apparatus 1 can obtain the height data associated with the table ID from the data recording section 110 and perform processing control, as in the first and second embodiments. In addition, in a case where only the height data is recorded on the information medium, the processing apparatus 1 can obtain the height data recorded on the information medium and perform processing control, as in the third embodiment. In addition, in a case where the table ID and the height data are recorded on the information medium, the processing apparatus 1 may obtain the height data associated with the table ID from the data recording section 110 and perform processing control, as in the first and second embodiments, or may obtain the height data recorded on the information medium and perform processing control, as in the third embodiment. Incidentally, in the case where the table ID and the height data are recorded on the information medium, the processing apparatus 1 may determine whether or not the height data associated with the table ID is recorded in the data recording section 110, and when the height data associated with the table ID is recorded in the data recording section 110, the processing apparatus 1 may determine whether or not the height data recorded on the information medium and the height data recorded in the data recording section 110 match each other. When the processing apparatus 1 determines that the pieces of height data match each other, the processing apparatus 1 may perform processing control using one of the pieces of height data. When the processing apparatus 1 determines that the pieces of height data do not match each other, the processing apparatus 1 may perform the height measurement again and perform processing control using obtained height data. Thus, processing control can be performed using the height data of higher reliability.

[Others]

Each of the foregoing embodiments is not only applicable to a processing apparatus such as a cutting apparatus but also similarly applicable to a laser processing apparatus. For example, the height data of a chuck table included in a laser processing apparatus can be obtained by a method similar to that of the foregoing embodiments, and a position of formation of a condensing point of a laser beam can be raised or lowered on the basis of the obtained height data. It is thereby possible to apply the laser beam at a uniform height of the workpiece irrespective of unevenness of the chuck table included in the laser processing apparatus. Processing quality can therefore be improved.

The constituent elements of the processing apparatus 1 described in each of the foregoing embodiments are functionally conceptual and do not necessarily need to be physically configured as illustrated in the figures. That is, a specific form of distribution and integration of the control unit 100 provided to the processing apparatus 1 is not limited to that illustrated in the figures, and the whole or a part of the control unit 100 can be configured so as to be distributed or integrated functionally or physically in any unit according to various kinds of loads, usage conditions, and the like. For example, the data recording section 110 and the processing control section 120 of the control unit 100 may be implemented in a state of being integrated functionally or physically with each other in the control unit 100.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
   a chuck table having a holding surface configured to hold a workpiece and a frame body surrounding the holding surface;
   a processing unit configured to process the workpiece held on the chuck table;
   a moving unit configured to move the chuck table and the processing unit relative to each other in an X-axis direction parallel with the holding surface and a Y-axis direction orthogonal to the X-axis direction;
   a height measuring unit fitted to the processing unit, the height measuring unit measuring, as height data, heights (Z) at a plurality of coordinates (X, Y) of the holding surface measured while the moving unit is moved, said height data being for each said chuck table of a plurality of chuck tables;
   a reading unit capable of reading an information medium; and
   a control unit, wherein
   the chuck table includes an information medium having identifying information associated with the chuck table that distinguishes the chuck table from other of said plurality of chuck tables, said information medium also including height data associated with the chuck table that is recorded prior to processing for each of said plurality of chuck tables;
   the reading unit reads the information medium of the chuck table installed in the processing apparatus, and
   the control unit includes:
      a height data recording section configured to record the height data and the identifying information in association with each other, and
      a processing control section configured to adjust a height of the processing unit during processing based on the height data associated with the identifying information read by the reading unit for said chuck table when said chuck table includes said information medium; and
   when said chuck table does not include said information medium, the control unit causes said height measuring unit to measure the height of said one of the plurality of chuck tables before processing.

2. The processing apparatus according to claim 1, wherein the information medium is formed by a two-dimensional code or a radio frequency tag of radio frequency identification in which information is written and read by wireless communication.

3. The processing apparatus according to claim 1, further comprising setting a plurality of measurement lines on the holding surface at a predetermined pitch prior to processing, said measurement lines extending in the X-axis direction and in the Y-axis direction and including the plurality of coordinates (X, Y) of the holding surface.

4. The processing apparatus according to claim 1, wherein the information medium includes a table storing the identifying information and height data for each chuck table of said plurality of chuck tables.

5. A processing apparatus comprising:
   a chuck table having a holding surface configured to hold a workpiece and a frame body surrounding the holding surface;
   a processing unit configured to process the workpiece held on the chuck table;
   a moving unit configured to move the chuck table and the processing unit relative to each other in an X-axis direction parallel with the holding surface and a Y-axis direction orthogonal to the X-axis direction;
   a height measuring unit fitted to the processing unit, the height measuring unit measuring, as height data, heights (Z) at a plurality of coordinates (X, Y) of the holding surface measured while the moving unit is moved, said height data being for each said chuck table of a plurality of chuck tables;
   a reading unit configured to read an information medium; and
   a control unit, wherein
   the chuck table includes the information medium having identifying information associated with the chuck table and the height data of the chuck table that is recorded prior to processing for each of said plurality of chuck tables, and
   the control unit includes a processing control section configured to adjust a height of the processing unit during processing based on the height data read by the reading unit for the chuck table when said chuck table includes said information medium; and
   when said chuck table does not include said information medium, the control unit causes said height measuring unit to measure the height data of said one of plurality of chuck tables before processing.

6. The processing apparatus according to claim 5, wherein the information medium is formed by a two-dimensional code or a radio frequency tag of radio frequency identification in which information is written and read by wireless communication.

7. The processing apparatus according to claim 5, further comprising setting a plurality of measurement lines on the holding surface at a predetermined pitch prior to processing, said measurement lines extending in the X-axis direction and in the Y-axis direction and including the plurality of coordinates (X, Y) of the holding surface.

8. The processing apparatus according to claim 5, wherein the information medium includes a table storing the identifying information and height data for each chuck table of said plurality of chuck tables.

* * * * *